United States Patent [19]

Higuchi et al.

[11] Patent Number: 5,008,998
[45] Date of Patent: Apr. 23, 1991

[54] METHOD OF MOUNTING FLAT COIL

[75] Inventors: Shigetaka Higuchi; Isao Noguchi; Tohru Odashima, all of Tochigi, Japan

[73] Assignee: Sony Corporation, Tokyo, Japan

[21] Appl. No.: 440,251

[22] Filed: Nov. 22, 1989

[30] Foreign Application Priority Data

Dec. 5, 1988 [JP] Japan ................ 63-307535

[51] Int. Cl.⁵ ............................................ C23C 26/00
[52] U.S. Cl. .................................. 29/840; 29/602.1; 427/116; 427/120; 427/191; 427/123; 427/126.3
[58] Field of Search ........... 427/116, 120, 191, 126.3, 427/123; 29/840, 602.1

[56] References Cited

U.S. PATENT DOCUMENTS

| | | | |
|---|---|---|---|
| 2,933,412 | 4/1960 | Thayer | 427/120 |
| 3,911,568 | 10/1975 | Hartleroad | 357/80 |
| 4,437,140 | 3/1984 | Ohyama | 174/257 |
| 4,503,605 | 3/1985 | Buckley | 427/116 |
| 4,644,643 | 2/1987 | Sudo | 29/843 |

FOREIGN PATENT DOCUMENTS

013305 1/1988 Japan .

Primary Examiner—Shrive Beck
Assistant Examiner—Vi Duong Dang
Attorney, Agent, or Firm—Hill, Van Santen, Steadman & Simpson

[57] ABSTRACT

The invention provides a mounting method by which a flat coil formed by winding an insulator layer and a metal foil sheet in layers can be mounted readily and with certainty on a circuit board. In mounting a flat coil on a circuit board, at first a pair of terminal portions each composed of a layer of solder are formed at a first end portion and a last end portion of the flat coil such that they extend in an axial direction of the coil, and then the coil is disposed on the circuit board such that the terminal portions thereof may be opposed in a perpendicular relationship to connecting faces of a conductor pattern on the circuit board. After then, the coil and the circuit board are heat processed to cause solder material applied to the connecting portions of the conductor pattern to adhere to faces of the terminal portions over the full extent of the axial length of the flat coil to interconnect the connecting faces of the conductor pattern and the terminal portions of the flat coil.

5 Claims, 7 Drawing Sheets

METHOD OF MOUNTING FLAT COIL

BACKGROUND OF THE INVENTION

1. Field of the Invention

This invention relates to a method of mounting, on a circuit board, a flat coil which is used with a motor, a deflecting yoke, a transformer and so forth.

2. Description of the Prior Art

Conventionally, a wound coil wherein a copper wire is wound in a number of layers is commonly used as a coil for a motor or for a deflecting yoke of a Braun tube. As miniaturization of appliances proceeds, so-called flat coils which are progressively reduced in thickness are developed and put into practical use.

As a coil for a deflecting motor, a sheet coil is used which is produced by forming a spiral pattern with a width of 50 microns or so by etching on copper foil laminated on an insulator sheet to construct a coil. Such sheet coil significantly contributes to reduction in thickness and in overall size of a motor.

On the other hand, such an idea has been proposed that copper foil to which an insulator film is applied is wound in layers and cut into round slices to produce flat coils. Such a flat coil has many advantages that it is superior in reduction in thickness and overall size of a motor, that it is easy to produce, and so forth.

By the way, the present applicant has proposed, in Japanese Patent Application No. 61-156135, a flat coil wherein a bar-like terminal portion or portions are disposed in an integral relationship on an outer peripheral face and/or an inner peripheral face of the flat coil and extend in a direction of the thickness of the flat coil, that is, in an axial direction of the flat coil.

In the flat coil, the bar-like terminals are provided in an integral relationship at a first portion and a last portion of a winding of copper foil which is wound in layers with such a thickness with which a desired characteristic is obtained, and a coiled portion of the flat coil is formed from a layered body consisting of the copper foil and a bonding agent layer laminated on the copper foil and serving as an insulator layer. Then, such flat coil is produced by soldering a conductor metal bar to one end of an original article (an article before it is cut into round slices) of the layered body, winding the original article around a predetermined take-up shaft and then cutting it into wound slices of a desired thickness or axial length.

With such a flat coil as described above, since metal parts which later make terminals are mounted, upon production of the flat coil, onto a soft and weak layered body of a thickness of about 55 microns or so constituted from copper foil and a bonding agent, a step or shoulder may be produced, upon soldering of the metal bar or upon winding of the layered body, due to a distortion or a difference in thickness to cause a break, cutting or the like of the copper foil.

Since the metal bars have no degree of freedom, a distortion or a wrinkle may take place on the layered body consisting of copper foil and so forth and may cause inaccuracy in dimension.

Further, even if the metal parts should not be soldered partially to the layered body, they may come behind the other metal bars, and consequently, it is often difficult to clearly confirm such defects.

Also when the flat coil is to be mounted onto a circuit board, solder material may not adhere well to a terminal in the form of a metal bar due to oxidation of a surface of the terminal and the terminal may not be soldered well to the layered body. The flat coil is thus disadvantageous in reliability in mounting thereof.

SUMMARY OF THE INVENTION

It is an object of the present invention to provide a method of mounting a flat coil by which mounting of a flat coil particularly onto a circuit board can be achieved readily and with certainty.

In order to attain the object, according to the present invention, there is provided a method of mounting a flat coil, which comprises the steps of forming, at a first end portion and a last end portion of a flat coil which is formed by winding an insulator layer and a metal foil sheet in layers, a pair of terminal portions each composed of a layer of solder and extending over the full extent of an axial length of the flat coil, preparing a circuit board which has formed thereon a conductor pattern which has connecting faces for connection to the terminal portions of the flat coil, coating solder material on the connecting faces of the conductor pattern, disposing the flat coil on the circuit board such that the terminal portions thereof may be opposed in a perpendicular relationship to the connecting faces of the conductor pattern, and heat processing the solder material to cause the solder material to adhere to faces of the terminal portions over the entire extent of the axial length of the flat coil to interconnect the connecting faces of the conductor pattern and the terminal portions of the flat coil.

According to the mounting method, a flat coil is placed on a circuit board, and solder material applied to connecting portions of a conductor pattern of the circuit board is heated in order to mount the flat coil on the circuit board. In this instance, since terminal portions of the coil are each formed from a layer of solder and the coil is disposed in such a positional relationship that the terminal portions thereof may extend perpendicularly to the connecting portions of the conductor pattern, the solder material is well adapted to the terminal portions of the coil so that the coil is soldered over the full extent of the terminal portions thereof to the circuit board. Further, even if the solder is applied with a smaller thickness than the length of the terminal portions of the coil in the axial direction of the coil, the solder in a molten condition will flow along the terminal portions of the coil over the full axial length due to an affinity thereof with the solder material of the terminal portions. Consequently, a good soldered condition is assured between the coil and the circuit board, and mounting of the flat coil can be attained readily and with certainty.

The above and other objects, features and advantages of the present invention will become apparent from the following description and the appended claims, taken in conjunction with the accompanying drawings.

DETAILED DESCRIPTION OF THE PREFERRED EMBODIMENTS

Figure 3:
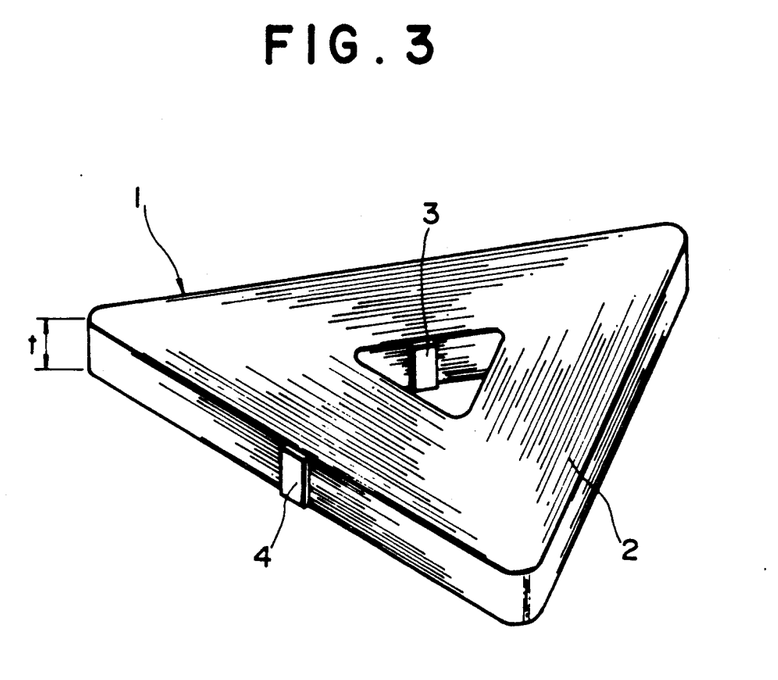
FIG. 3 is a perspective view of a flat coil which is used in the mounting method of the present invention.

Referring first to FIG. 3, there is shown a flat coil which is used in a mounting method according to the present invention. The flat coil shown is generally denoted at 1 and includes a pair of terminals 3 and 4 each formed from a layer of solder and provided in an integral relationship at a first end and a last end of a winding of copper foil 2 which is wound in layers with a thickness with which a desired characteristic is obtained. The flat coil 1 has a thickness or length t in its axial direction, and the terminals 3 and 4 thereof extend over the entire axial length of the flat coil 1 on inner and outer peripheral faces of the flat coil 1.

Figure 4:
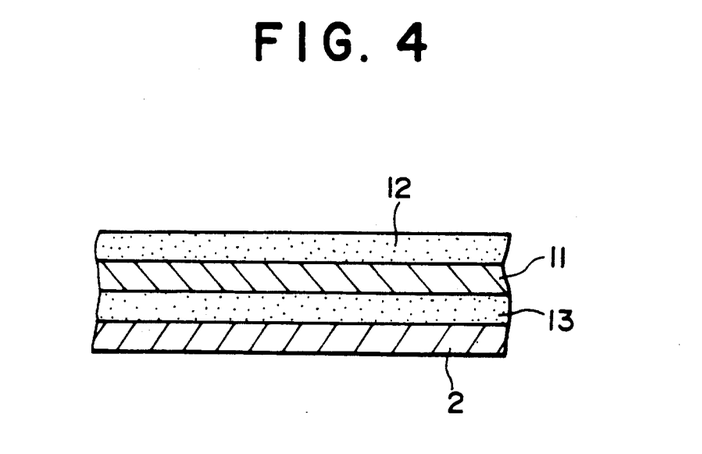
FIG. 4 is an enlarged partial sectional view of an original article from which coils are to be produced.

Referring also to FIG. 4, a pair of bonding agent layers 12 and 13 serving as insulator layers are laminated on the copper foil 2 which forms a coil portion of the flat coil 1. In particular, in the flat coil 1 shown, the two bonding agent layers 12 and 13 are coated on a surface of the copper foil 2 with a high molecular film 11 such as a polyimide film held between the layers 12 and 13 so as to assure the insulator layers. Here, the copper foil 2 has a thickness of 35 microns while each of the bonding agent layers 12 and 13 has a thickness of 6 microns, and the high molecular film 11 is a polyimide film having a thickness of 13 microns. It is to be noted that the high molecular film 11 is not always necessary, and though not shown, the bonding agent layers 12 and 13 may otherwise be coated on the opposite surfaces of the copper foil 2.

The terminals 3 and 4 attached to the winding starting position (i.e., the inner peripheral face of the coil) and the winding ending position (i.e., the outer peripheral face of the coil) of the copper foil 2 are each formed as a solder layer preferably having a thickness smaller than 0.2 mm, for example, a thickness of 0.1 mm in the present example. Since the terminal 3 in the flat coil 1 shown is formed as a thin solder layer of a thickness of about 0.1 mm, even if the flat coil is produced through a step of winding the copper foil 2 in a number of layers around a core member 7 which will be hereinafter described, the flat coil 1 can have a high reliability free from such a defect as a break of the copper foil 2.

Subsequently, a process of producing such a flat coil 1 as described above will be described.

Figure 5:
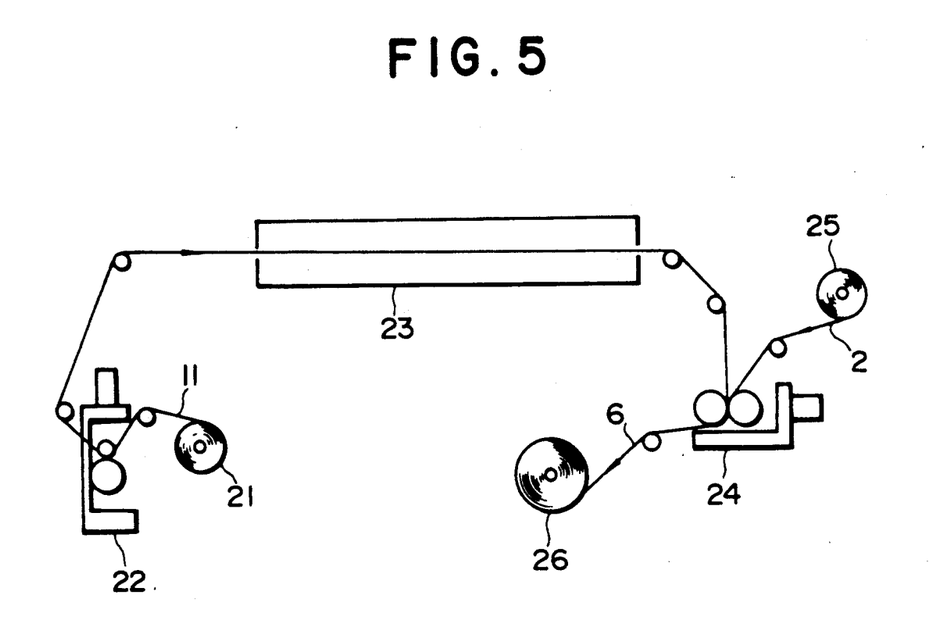
FIG. 5 is a schematic illustration showing a step of forming an insulator layer on copper foil in a process of production of such flat coil as shown in FIG. 3.

At first, a high molecular film 11 or bonding agent layers 12 and 13 are laminated on copper foil 2 as a material of a flat coil using such an apparatus as shown in FIG. 5. In particular, referring to FIG. 5, a high molecular film 11 supplied from a supply roll 21 is introduced to a bonding agent applicator 22 by means of which a bonding agent is coated on the opposite surfaces of the high molecular film 11. Then, the high molecular film 11 is passed through a drier 23 to dry the bonding agent layers to a tack dry condition, and then it is compressed and adhered by a laminater 24 to copper foil 2 supplied from a supply roll 25 and is then taken up onto a take-up roll 26. Through the steps, a roll of an original roll of a layered body 6 is obtained which consists of the copper foil 2, high molecular film 11 and bonding agent layers 12 and 13.

Figure 6:
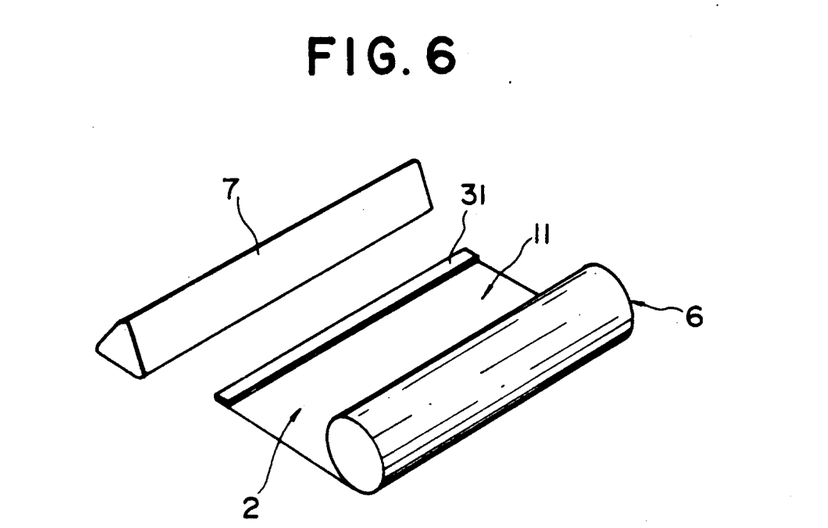
FIG. 6 is a perspective view illustrating a winding step of copper foil around a shaft in the process of production.
Figure 7:
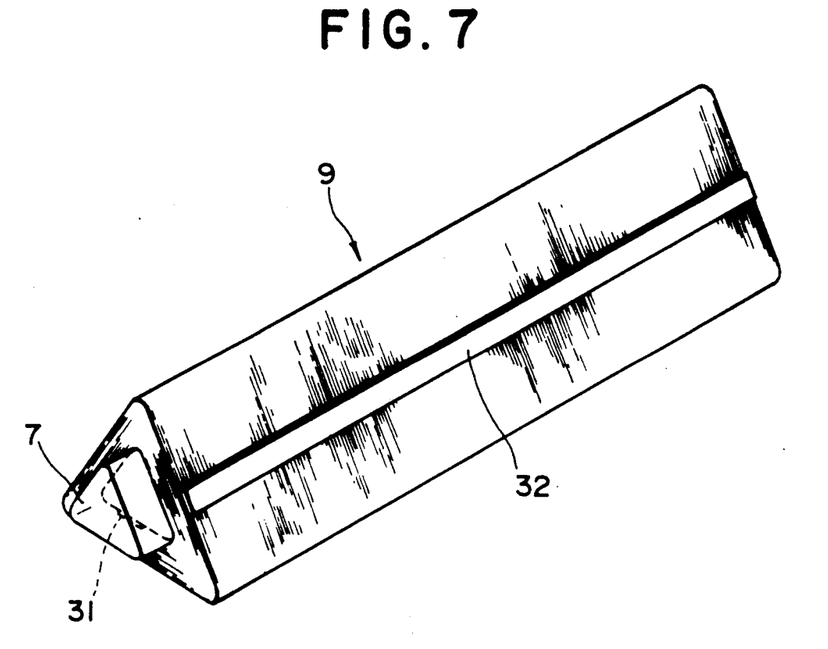
FIG. 7 is a perspective view of a coil block from which flat coils are to be produced by cutting.

Then, the original article roll of the layered body 6 is cut with a predetermined width by means of a cutting machine, and then, for example, solder in the form of a bar or cream solder is melted at one end (the winding starting position of the coil) of the layered body 6 of the original article roll to form a solder layer 31 as shown in FIG. 6. The solder layer 31 later makes the terminal 3. The width of the solder layer 31 is about 2 mm in the case of the present flat coil, and such solder in the form of a bar or cream solder used has a melting point of about 180 degrees C.

In particular, in case, for example, solder in the form of a bar is used, on condition that the solder consists of 60% of tin and 40% of lead by weight and has a melting point of 183° C., the solder is applied such that the width of application may be 0.5 mm to 10 mm and the thickness of application may be 0.005 mm to 0.2 mm, using a soldering robot. It is to be noted that, if the thickness of a solder layer is set to a value smaller then 0.005 mm, then the solder cannot be applied uniformly on a surface of the layer body 6, and consequently, the lower limit of the thickness is 0.005 mm. Meanwhile, the upper limit is smaller than 0.5 mm from the point of view of such a problem in winding of the layered body 6 as described hereinabove. Preferably, the thickness is 0.01 mm to 0.2 mm.

On the other hand, in the case of cream solder, cream solder consisting of 60% of tin and 40% of lead by weight may be printed on a surface of the copper foil 2 using a cloth of silk or a batten. In this instance, the width of print should be 0.5 mm to 10 mm, and the thickness of print should be 0.02 mm to 0.2 mm. It is to be noted that, since printing is difficult where the thickness of cream solder is set to a value smaller than 0.2 mm, the lower limit of the thickness is 0.02 mm. Meanwhile, the upper limit is 0.5 mm. Then, the printed portion is heated to the temperature of 300° C. to melt the cream solder. It is to be noted that similar effects can be obtained if the compositions and the melting points of the solder in the form of a bar and the cream solder are set, for example, to values listed in tables below. It is to be noted that the rates of individual components of the solders are represented by weight percent in the tables below.

(1) IN THE CASE OF BAR-LIKE SOLDER

| Composition | | | Melting Point |
| --- | --- | --- | --- |
| Sn 63% | Pb 37% | | 184° C. |
| Sn 60% | Pb 37.5% | Ag 2.5% | 178° C. |
| Sn 25% | Pb 75% | | 183° C. |

(2) IN THE CASE OF CREAM SOLDER

| Composition | | | Melting Point |
| --- | --- | --- | --- |
| Sn 63% | Pb 37% | | 178° C. |
| Sn 62% | Pb 37% | Ag 2% | 180° C. |
| Sn 35% | Pb 44% | Bi 21% | 135° C. |

Subsequently, the layered body 6 is wound around such a core member or shaft 7 as seen in FIG. 6 by way of, for example, a water soluble bonding agent. The sectional shape of the core member 7 may coincide with a desired shape of a coil to be produced and may be a triangular, circular, elliptical, polygonal or some other shape.

Then, after the layered body 6 is wound around the core member 7 in a number of layers with a thickness with which a desired characteristic can be obtained, a solder layer 32 which will later make the terminal 4 is formed at a last end portion of the layered body 6 (the winding last end of the coil). The width of the solder layer 32 is about 2 mm similarly to that of the solder layer 31 formed at the winding starting end of the coil described hereinabove. It is to be noted that, in the case of the present example, when the layered body 6 is wound around the core member 7, the layered body 6 is compressed from the three directions by means of air cylinders not shown to arrange the winding condition of a coil block 9 which will be hereinafter described.

It is to be noted that, while the thickness of the solder layer 31 is about 0.1 mm in the present example, even if the layered body 6 is wound in a number of layers around the core member 7 as described above, the layered body 6 will not be swollen outwardly to a significant degree, and consequently, such a defect as a break of the copper foil 2 will not take place.

Figure 8:
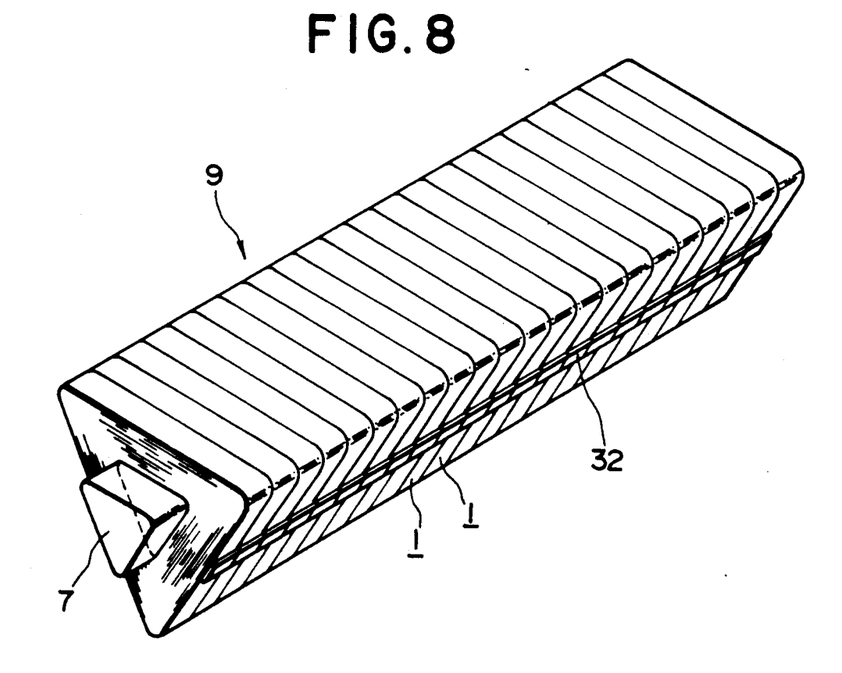
FIG. 8 is a perspective view showing the coil block of FIG. 7 but after a cutting step.

A coil block 9 is thus formed by the entire block produced by the process described above. The coil block 9 is then cut into a number of coils 1 having a predetermined width or axial length t as shown in FIG. 8, thereby obtaining such a flat coil having an appearance as shown in FIG. 1. It is to be noted that an entire surface (upper and lower faces and inner and outer peripheral faces in FIG. 3) of the flat coil 1 except the terminals 3 and 4 is coated for insulation. The cutting method may be a mechanical cutting method, an electric discharge machining method, a cutting method based on a laser or some other suitable method. If a flat coil 1 after cutting is put into water, then the core member 7 is released from the flat coil 1, thereby completing the flat coil 1. The flat coil 1 produced in this manner has such a feature that the copper foil 2, bonding agent layer 11 and 12 and high molecular film 11 are layered closely with each other and the terminals 3 and 4 are adhered firmly to the copper foil 2 so that they will not be separated from the latter readily. Accordingly, the flat coil 1 has a very high reliability. Since the terminals 3 and 4 composed of thin solder layers are formed on the inner and outer peripheral faces and extend in the direction of the width or axial length t of the flat coil 1, there is no possibility that, upon winding in the process of production, the layered body 6 composed of the copper foil 2 and so forth may be broken or damaged. Besides, even when the layered body 6 is wound after the terminals are attached to the original article of the layered body 6, an error in dimension which may be caused by a distortion, a wrinkle or the like of the copper foil 2 is prevented. Further, since the terminals 3 and 4 are composed of solder layers, they are all soldered to the layered body 6, which will not cause incomplete conduction which may otherwise occur at a cut portion. In addition, since the terminals 3 and 4 are each composed of a solder layer having a thickness smaller than 0.2 mm, even if the layered body 6 is wound in a number of layers around the core member 7 after the terminals 3 and 4 are attached to the original article of the layered body 6, such a condition will not occur that only portions of the layered body 6 around the terminals are swollen to a great extent, and a break and disconnection of the copper foil 2 can be prevented.

Figure 1A:
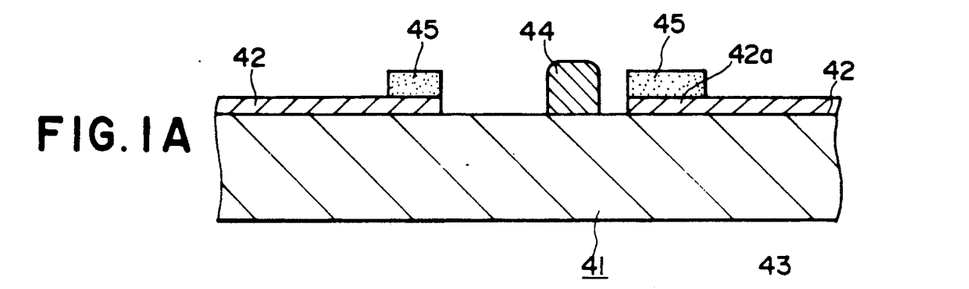
FIGS. 1A, 1B and 1C are schematic sectional views showing a series of steps of a mounting method according to the present invention.
Figure 1B:
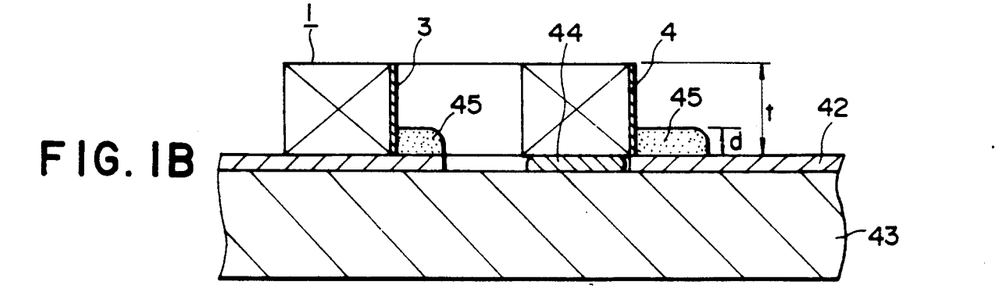
Figure 1C:
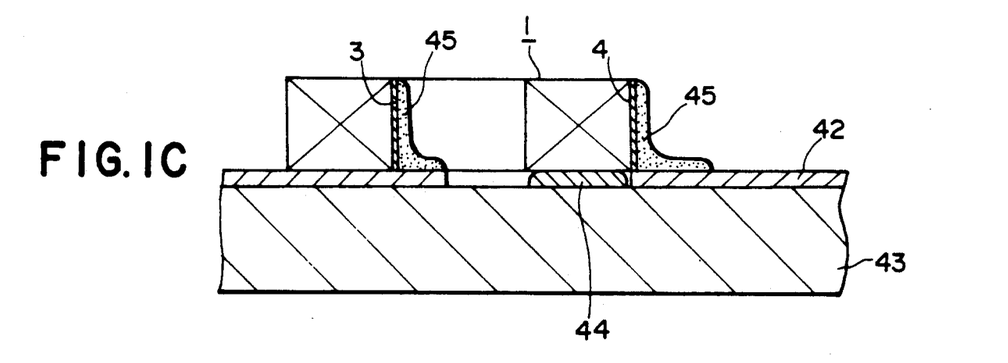
Figure 2:
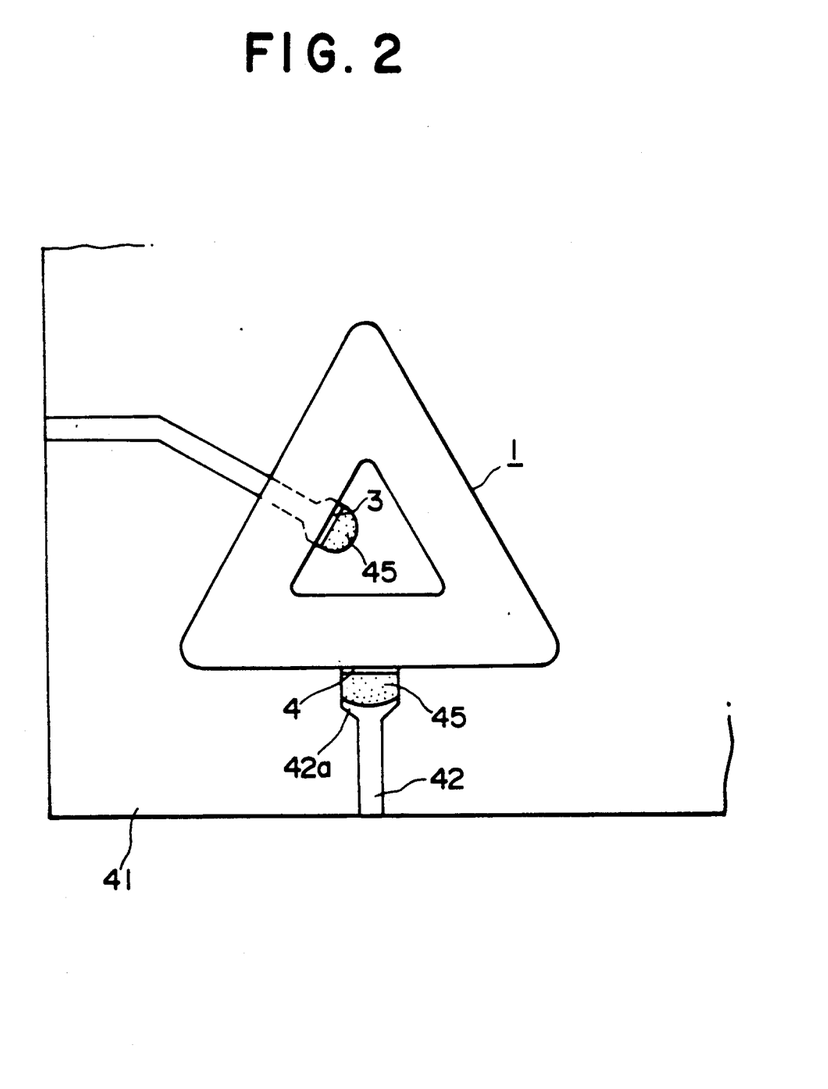
FIG. 2 is a plan view of a flat coil mounted in accordance with the mounting method of the present invention.

Then, the flat coil 1 constructed in such a manner as described above is mounted onto a circuit board 41 as shown in FIGS. 1 and 2. In particular, at first a bonding agent 44 for temporary fixation is applied by printing to a location at which the flat coil 1 is to be disposed on a circuit board 41 which has a conductor pattern 42 formed on a face of an insulator base plate 43 as shown in FIG. 1A. Meanwhile, solder material such as, for example, cream solder 45 is adhered to faces 42a of connecting portions of the conductor pattern 42 to which the terminals 3 and 4 of the flat coil 1 are to be electrically connected. The thickness d of the cream solder 45 is smaller than the width or axial length of the terminals 3 and 4 of the flat coil 1. Then, the flat coil 1 is disposed on the circuit board 41 such that, as shown in FIG. 1B, the terminals 3 and 4 thereof may come near the connecting portions to which the cream solder 45 is applied and may extend perpendicularly to the faces of the connecting portions 42a. Thereupon, the flat coil 1 is temporarily secured to the conductor pattern 42 by the bonding agent 44. Subsequently, while the flat coil 1 is held in a temporarily secured condition as shown in FIG. 1C, it is placed into a heating furnace to melt the cream solder 45 in order to solder the terminals 3 and 4 of the flat coil 1 to the corresponding connecting portions of the conductor pattern 42. In this instance, since the terminals 3 and 4 of the flat coil 1 are each constituted from a solder layer, the molten cream solder 45 is adapted well to the terminals 3 and 4 so that it flows along the surfaces of the terminals 3 and 4 until it adheres over the entire width (axial length of the flat coil 1) of the terminals 3 and 4. Consequently, good soldering is assured.

With the mounting method of the flat coil described above, the flat coil 1 can be soldered readily and with certainty by applying the cream solder 45 by printing and placing the flat coil 1 in a temporarily secured condition into the heating furnace, and accordingly, mounting of a flat coil of the type mentioned can be simplified. Further, since the terminals 3 and 4 of the flat coil 1 are formed from solder layers, they are good in adaptation to the solder material 45, and even if the solder 45 is applied which has a thickness d greater than the axial length t of the terminals 3 and 4, the flat coil 1 can be soldered with certainty.

Figure 11A:
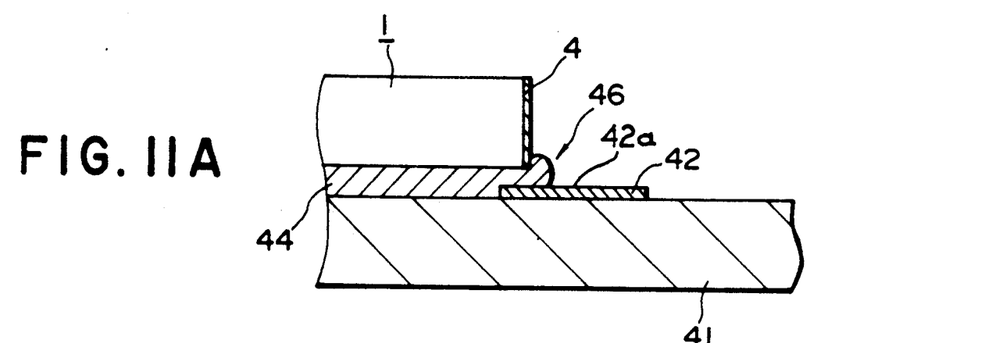
FIGS. 11A and 11B are sectional views showing a flat coil before and after it is soldered to a circuit board in accordance with a conventional mounting method.
Figure 11B:
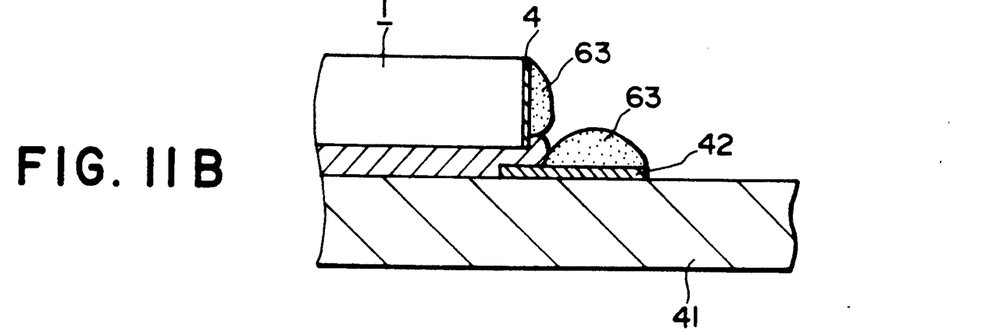

By the way, when the flat coil 1 is to be mounted on the circuit board 41 as shown in FIG. 11A, the bonding agent 44 for temporary fixation sometimes protrudes from between the coil terminal 3 or 4 and the corresponding connecting portion 42a of the conductor pattern 42 to form a portion 46 which has little wettability to solder. In such an instance, while the connecting portions 42a of the conductor pattern 42 of the circuit board 41 and the terminals 3 and 4 of the flat coil 1 are individually wet to solder material 63, there is the possibility that such solder material masses 63 may be separated from each other and not be connected to each other as seen in FIG. 11B. This phenomenon may occur in mounting not only of such flat coil 1 but also of a so-called tip part. Description will be subsequently given of a solder material for use in a method according to the present invention which assures soldering even where there is a portion which has no or little solder wettability between a terminal of a tip part and a connecting portion of a conductor pattern on a circuit board.

Figure 9:
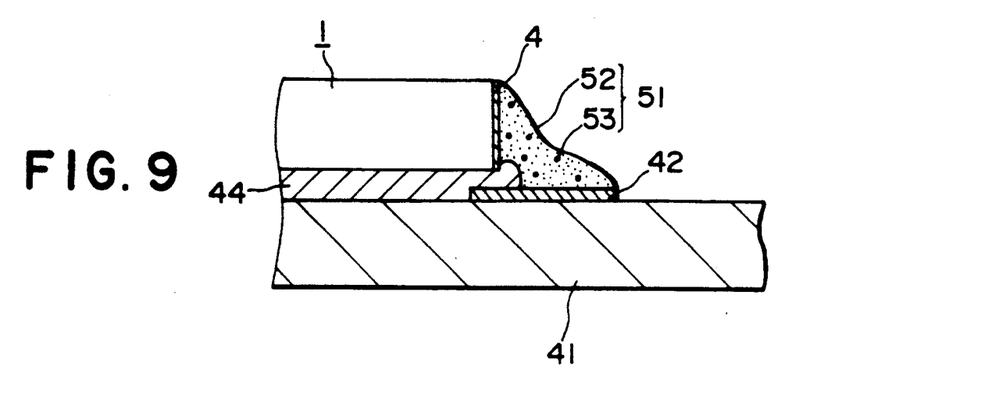
FIG. 9 is a schematic sectional view of a coil mounted on a circuit board by the method of the present invention showing another embodiment of the present invention.
Figure 10:
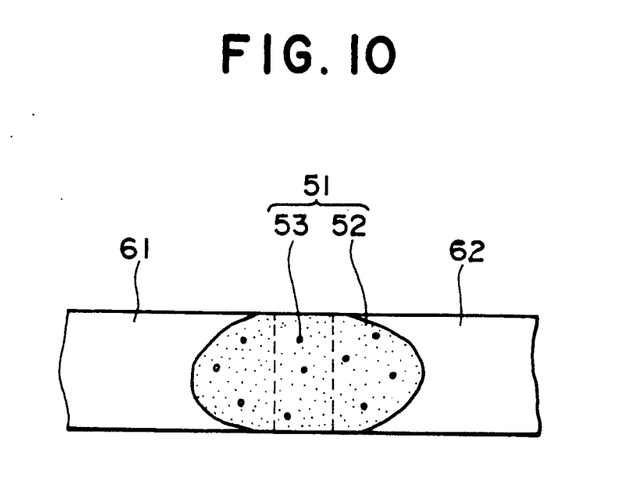
FIG. 10 is a schematic plan view of a pair of terminals which are soldered to each other in accordance with the present invention.

Referring to FIG. 9, a solder material 51 which is used in a method according to the present invention is composed of ordinary solder 52 and minute conductive substance 53 having a wettability to solder and having a higher melting point than the solder 52, such as, for example, conductive particles or conductive fiber. In particular, preferably the minute conductive substance 53 is a material which has some solder wettability and is so low in solubility into molten solder that, even if solder is melted, it can maintain its original form, for example, its particle form in the molten solder. For example, a noble metal such as Pt, Au or the like, carbon, Al, Ni, Cr, Zn, Fe, Cu or the like can be used for the minute conductive substance 53. Further, the minute conductive substance 53 may be mixed by 10 to 100 weight parts with respect to 100 weight parts of the solder 52. The particle size and shape of the minute conductive material may be selected suitably in accordance with an application of the solder material, but preferably the particle size is so small that blinding of a printing screen or a dispenser may not be caused upon supply of cream solder but so large that a mass of solder supplied may not collapse when it is melted. Accordingly, the particle size of the minute conductive substance should be 5 to 75 microns or so. If the minute conductive substance 53 is mixed less than 10 weight parts, the solder material is so higher in fluidity that it is likely to cause aggregation thereof and hence separation of masses thereof. Consequently, the anticipated effect to be attained by mixing of the minute conductive substance 53 cannot be attained. On the contrary, where the minute conductive substance 53 is mixed more than 100 weight portions, the solder material is so low in fluidity that the adhering property to a terminal, a conductor pattern and so forth is too low. Besides, when the solder material is to be applied by screen printing, the solder material (solder paste) will not readily pass through a screen, which makes printing difficult.

Where the solder material 51 wherein the minute conductive substance 53 is contained in the solder 52 is used, even if the bonding agent 44 protrudes from between the terminal 3 or 4 of the flat coil 1 and the corresponding connecting portion 42a of the conductive pattern 42 on the circuit board 51, the conductive substance 53 acts as a binder so that the terminal 3 or 4 and the corresponding connecting portion 42a can be soldered well to each other without causing separation of the solder material 51 into masses.

Figure 12:
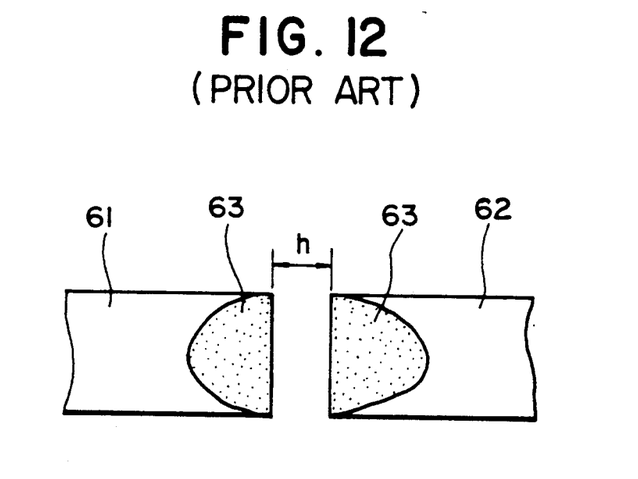
FIG. 12 is a schematic plan view of a pair of terminals which are soldered to each other in accordance with a conventional soldering technique.

The solder material 51 in which such minute conductive material 53 is mixed can be applied also to connection by soldering between a pair of terminals disposed in a spaced relationship on a circuit board or the like. For example, in case the distance h between a pair of terminals 61 and 62 is very great as shown in FIG. 12, if it is tried to connect the two terminals 61 and 62 only using ordinary solder 63, the solder masses 63 will remain separate from each other and will not be connected to each other. Therefore, according to a conventional technique, a lead wire is placed across the two terminals 61 and 62 and then the solder 63 is placed over the lead wire in order to interconnect the terminals 61 and 62 by means of the lead wire and the solder 63. To the contrary, if the solder material 51 is used wherein the minute conductive substance 53 in the form of particles or fiber is mixed in the solder 52, then the terminals 61 and 62 which are disposed in a spaced relationship from each other can be interconnected only by soldering without using a lead wire.

Having now fully described the invention, it will be apparent to one of ordinary skill in the art that many changes and modifications can be made thereto without departing from the spirit and scope of the invention as set forth herein.

What is claimed is:

1. A method of mounting a flat coil, comprising the steps of:

forming, at a first end portion and a last end portion of a flat coil which is formed by winding an insulator layer and a metal foil sheet in layers, a pair of terminal portions each composed of a layer of solder and extending over the full extent of an axial length of said flat coil;

preparing a circuit board which has formed thereon a conductor pattern which has connecting faces for connection to said terminal portions of said flat coil;

coating solder material on said connecting faces of said conductor pattern;

disposing said flat coil on said circuit board such that said terminal portions thereof are opposed in a perpendicular relationship to said connecting faces of said conductor pattern; and heat processing said solder material to cause said solder material to adhere to faces of said terminal portions over the entire extent of the axial length of said flat coil to interconnect said connecting faces of said conductor pattern and said terminal portions of said flat coil.

2. A method of mounting a flat coil according to claim 1, wherein the solder layers formed at said terminal portions of said coil have a width ranging from 0.5 mm to 10 mm and a thickness ranging from 0.005 mm to 0.2 mm while the solder material coated on said substrate is formed with a width ranging from 0.5 mm to 10 mm and a thickness ranging from 0.02 mm to 0.2 mm.

3. A method of mounting a flat coil according to claim 1, wherein the melting point T1 of the solder used for said terminal portions of said coil and the melting point T2 of the solder used for said connecting faces of said substrate have a relationship of $$T1 \geq T2$$

4. A method of mounting a flat coil according to claim 1, wherein the solder material coated on said connecting faces of said substrate is mixture paste of a minute conductive substance and an alloy for welding, and said minute conductive substance has a melting point higher than the melting point of the alloy for welding and is made of a material which is not melted at a temperature upon heat processing of said solder material and which is low in solubility to the alloy for welding in a molten condition.

5. A method of mounting a flat coil according to claim 4, wherein said alloy for welding contains Sn and Pb as principal components therein and further contains Ag and/or Bi therein if necessary while said minute conductive substance is either in the form of particles having a particle size ranging from 5 $\mu$m to 75 $\mu$m or in the form of fiber and is composed of at least one of the metals of Pt, Au, carbon, Al, Ni, Cu, Cr, Zn and Fe, said minute conductive substance having a composition ratio of 10 to 100 parts by weight with respect to 100 parts by weight of said alloy for welding.

* * * * *